(12) United States Patent
Stine (10) Patent No.: US 7,305,638 B1
(45) Date of Patent: Dec. 4, 2007

(54) METHOD AND SYSTEM FOR ROM CODING TO IMPROVE YIELD

(75) Inventor: Brian E. Stine, Tokyo-to (JP)

(73) Assignee: PDF Solutions, Inc., San Jose, CA (US)

(*) Notice: Subject to any disclaimer, the term of this patent is extended or adjusted under 35 U.S.C. 154(b) by 251 days.

(21) Appl. No.: 11/128,863

(22) Filed: May 13, 2005

Related U.S. Application Data (60) Provisional application No. 60/576,904, filed on Jun. 4, 2004.

(51) Int. Cl.
*G06F 17/50* (2006.01)
*G06F 9/455* (2006.01)
*G06F 15/00* (2006.01)

(52) U.S. Cl. .................. 716/4; 716/1; 716/19; 703/28; 712/15

(58) Field of Classification Search .................. 716/1, 716/4, 19; 365/94; 703/28; 712/15
See application file for complete search history.

(56) References Cited

U.S. PATENT DOCUMENTS

| | | | | |
|---|---|---|---|---|
| 4,546,456 A | * | 10/1985 | Buie | .......................... 365/227 |
| 5,745,734 A | * | 4/1998 | Craft et al. | .................... 716/16 |
| 6,096,091 A | * | 8/2000 | Hartmann | ..................... 716/17 |
| 6,587,364 B1 | | 7/2003 | Kablanian et al. | |
| 2004/0210814 A1 | * | 10/2004 | Cargnoni et al. | ........... 714/758 |

OTHER PUBLICATIONS

"Lossless Data Compression", http://www.data-compression.com/lossless.html, Apr. 20, 2005.

\* cited by examiner

*Primary Examiner*—Stacy A. Whitmore
*Assistant Examiner*—Magid Y. Dimyan
(74) *Attorney, Agent, or Firm*—Duane Morris LLP; Steven E. Koffs (57) ABSTRACT

A method for improving yield of a process for fabricating a read-only memory (ROM) includes evaluating a yield of a ROM fabrication process associated with a first ROM design. At least two candidate ROM design modifications are identified. At least one of the candidate ROM design modifications comprises inversion of bit values of data to be stored in the ROM. A plurality of criteria are applied, including at least an amount of yield improvement and a difficulty of implementation associated with each candidate ROM design modification. One of the candidate ROM design modifications is selected based on the application of the criteria. A modified ROM fabrication process is performed to fabricate a ROM according to the selected ROM design modification.

24 Claims, 9 Drawing Sheets

BEST AVAILABLE COPY

METHOD AND SYSTEM FOR ROM CODING TO IMPROVE YIELD

This application claims the benefit of priority of U.S. Provisional Application No. 60/576,904, filed Jun. 4, 2004.

FIELD OF THE INVENTION

The present invention relates to semiconductor fabrication generally, and more specifically to methods of analyzing and modifying semiconductor fabrication processes to improve process yield.

BACKGROUND

In view of the device and interconnect densities required in present day integrated circuits, it is imperative that the manufacturing processes be carried out with utmost precision and in a way that minimizes defects. For reliable operation, the electrical characteristics of the circuits must be kept within carefully controlled limits, which implies a high degree of control over the myriad of operations and fabrication processes. Once defective integrated circuits have been identified, it is desired to take steps to decrease the number of defective integrated circuits produced in the manufacturing process, thus increasing the yield of the integrated circuits meeting specifications.

In the past, many of the defects which caused poor yield in integrated circuits were caused by particulate contaminants or other random sources. Increasingly, many of the defects seen in modern integrated circuit processes are not sourced from particulates or random contaminants, especially in the earlier stages of process development or yield ramping, but rather stem from very systematic sources. Some of these systematic sources can be tied to specific characteristics of an IC design, such as the presence of a large number of metal-filled vias or contacts. Due to the way data bits are programmed in Read Only Memory (ROM), some ROMs contain high numbers of vias and/or contacts, which can have a systematic adverse impact on the yield of the process.

Some systematic yield problems are dealt with after production begins. However, the costs of development and today's compressed timelines make it desirable to analyze a proposed design to predict yield problems before actually producing a final product IC wafer. By identifying characteristics of an IC design that are likely to have unfavorable impact on yield, these design problems can be corrected before a full set of masks is made for the IC.

SUMMARY OF THE INVENTION

In some embodiments, a method for improving yield of a process for fabricating a design containing read-only memory (ROM) includes evaluating a yield of a fabrication process associated with a first ROM containing design. At least two candidate ROM design modifications are identified. At least one of the candidate ROM design modifications comprises inversion of bit values of data to be stored in the ROM. A plurality of criteria are applied, including at least an amount of yield improvement and a difficulty of implementation associated with each candidate ROM design modification. One of the candidate ROM design modifications is selected based on the application of the criteria. A modified ROM fabrication process is performed to fabricate a ROM according to the selected ROM design modification.

In some embodiments, a method of improving the yield of a process for fabricating a design containing read-only memory (ROM), comprises evaluating a fabrication process associated with a first design containing ROM. At least two candidate ROM design modifications are evaluated. At least one of the candidate ROM design modifications comprises inversion of bit values of data to be stored in the ROM. At least one of the candidate ROM design modifications comprises storing the data in a compressed form. A plurality of criteria are applied, including at least an amount of yield improvement and a difficulty of implementation associated with each candidate ROM design modification. One of the candidate ROM design modifications is selected based on the application of the criteria. A modified ROM fabrication process is performed to fabricate a ROM according to the selected ROM design modification.

DETAILED DESCRIPTION

U.S. Provisional Application No. 60/576,904, filed Jun. 4, 2004, is incorporated by reference as though set forth in its entirety herein.

This description of the exemplary embodiments is intended to be read in connection with the accompanying drawings, which are to be considered part of the entire written description.

The method and system described below provide a means to optimize the yield of a design containing ROM for a particular fabrication process by changing the storage method. Two methods can be used to store values in a ROM layout. In the first method referred to as, "positive coding," a contact/via/implant layer can be used to store a one, and the absence of a contact/via/implant layer can be used to store a zero. "Negative coding" is the reverse. The absence of a contact/via/implant layer signifies a one, while the presence of a contact/via/implant layer signifies a zero. By changing the design of the sense amp that reads the values from the ROM, either storage method can be correctly read out of the array.

For each via/contact/implant item that is used in a ROM, there is some yield loss associated with it. This can be understood by assuming that the probability of a contact or via failing is p. Then, the yield of trying to make N vias or contacts can be modeled as $\exp(-Np)$ assuming independent random events. Thus, given a ROM array with many contacts/via in it, the yield loss will be high if positive coding is used and yield loss will be lower if a negative coding is used. One can conclude that, if the stored data include many ones, then a negative coding method is optimum from a yield perspective. If the stored data include many zeros, then a positive coding method is optimum from a yield perspective. If the stored data comprise almost equal numbers of zeros and ones, then either method is optimum. Such optimization could be done in a block by block mode if multiple ROM arrays are used in a design.

Various methods are described below for estimating the yield impact of selecting the coding method and methods for implementing the coding method in a design.

Further, code compression improves yield by the following mechanism: if the code is compressed, there are fewer bits to store (because they are compressed). Given fewer bits to store, the number of "1"s stored will be much fewer and the size of the ROM will be smaller. Ultimately, this results in higher yield. Code compression can be advantageous on larger ROMs, Code compression involves some accessory logic to do the decompression, resulting in overhead. One can calculate during design which size ROMs benefit from code compression. The description below includes a procedure for determining which ROMs, if any, should be modified to include code-compression or "modified-code-compression" (which is performed in an embedded microprocessor, instead of application specific hardware logic and doesn't have the accessory logic penalty).

Figure 10:
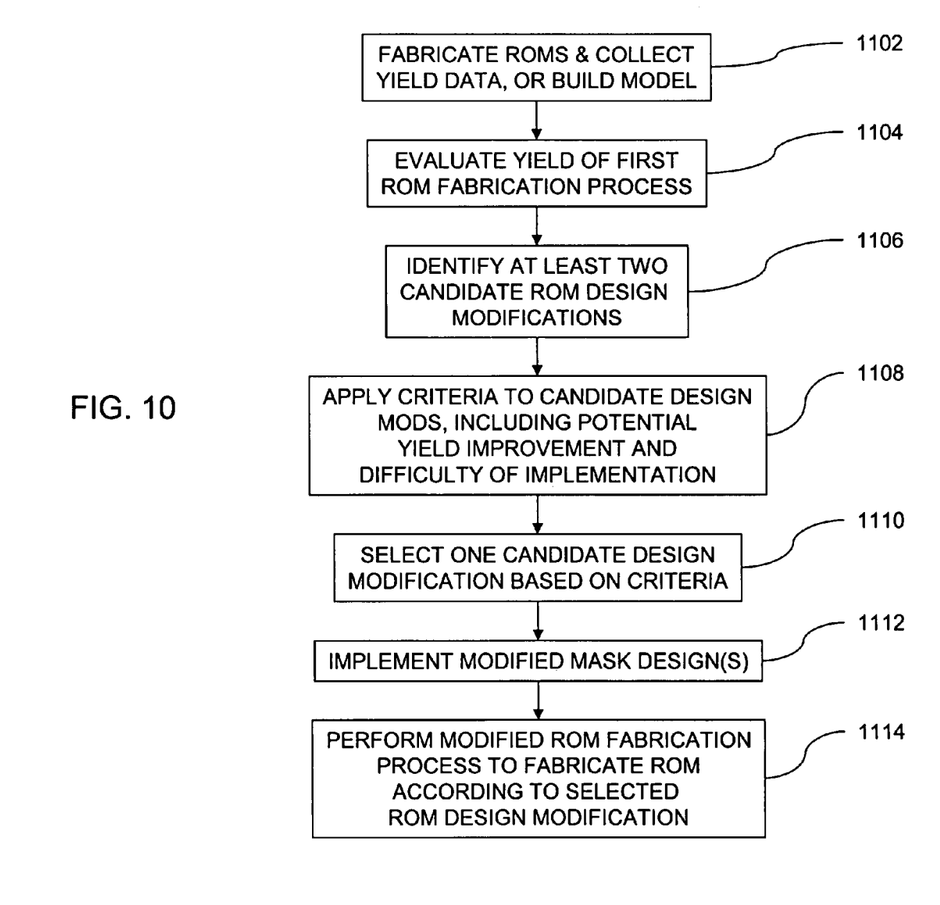
FIG. 10 is a flow chart diagram of an exemplary method for analyzing and selecting one of a plurality of candidate design modifications for a ROM.

FIG. 10 is a flow chart diagram of a general method for analyzing and modifying the storage method to improve the yield of a process for fabricating a read-only memory (ROM).

At step 1102, if the process is operational, ROMs are fabricated and yield data are collected. Alternatively, if the masks have not yet been implemented for use in the process a yield model may be built.

At step 1104, a yield of a ROM fabrication process associated with a first ROM design is evaluated, either using actual data collected from the process, or using the yield model.

At step 1106, at least two candidate ROM design modifications are identified. At least one of the candidate ROM design modifications comprises inversion of bit values of data to be stored in the ROM. In some embodiments, at least one of the remaining candidate ROM design modifications comprises compression of the data.

At step 1108, a plurality of criteria are applied, including at least an amount of yield improvement and a difficulty of implementation associated with each candidate ROM design modification (for example, the number of lithographic masks that must be reworked or replaced to implement each modification). In some embodiments, the amount of yield improvement needed is also included in the criteria.

At step 1110, one of the candidate ROM design modifications is selected based on the application of the criteria.

At step 1112, mask designs are changed (and masks according to the modified designs are fabricated) to implement the selected modification.

At step 1114, the selected ROM design modification is fabricated.

Figure 1:
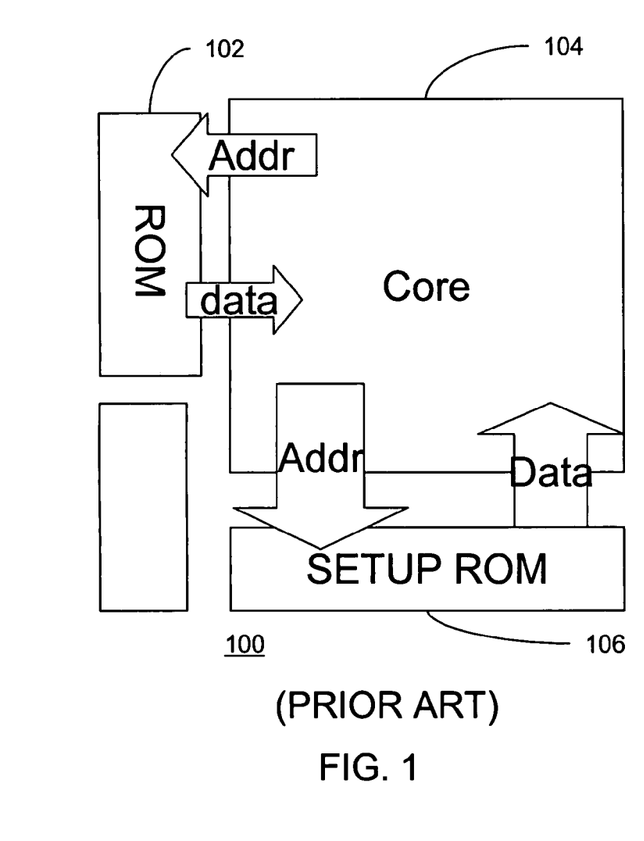
FIG. 1 is a block diagram showing a conventional system on a chip design with embedded ROM.

FIG. 1 is an example of a conventional design with embedded ROM 100, including a ROM array 102 of storage elements, a core processor 104, and a ROM 106. An analysis of the data to be stored in the ROM array may indicate that if the ROM 106 has many contacts/via in it, the yield loss will be high if positive coding is used and yield loss will be lower if a negative coding is used.

Figure 2:
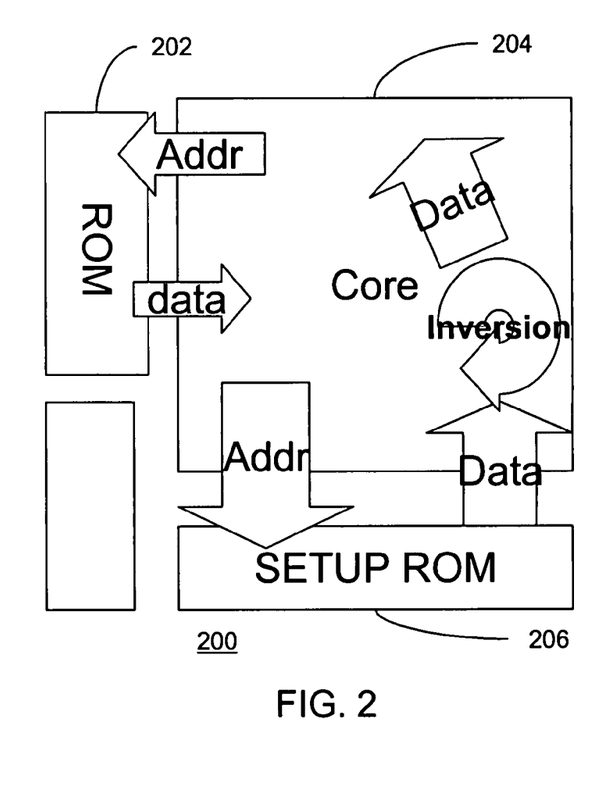
FIG. 2 is a block diagram showing an embodiment of a ROM including inversion by a microprocessor upon retrieval of the data.

FIG. 2 shows one exemplary candidate method for improving yield, by inverting the data during programming (by a mask change), and inverting the data again when the data are retrieved. ROM 200, includes a ROM array 202 of storage elements, a core processor 204, and a ROM 206. The data are inverted by executing an INV opcode in the core processor 204, thus avoiding the need to add any logic to perform the inversion operation. This candidate design modification is the easiest to implement. and can be achieved using a modified version of at least one mask used in the first ROM design to make the ROM 202, so that the ROM stores bit values that are inverted relative to the bit values of the first ROM design. The bit values from the ROM are read in and inverted using an embedded microprocessor before utilizing the data represented by the inverted bit values.

Figure 11:
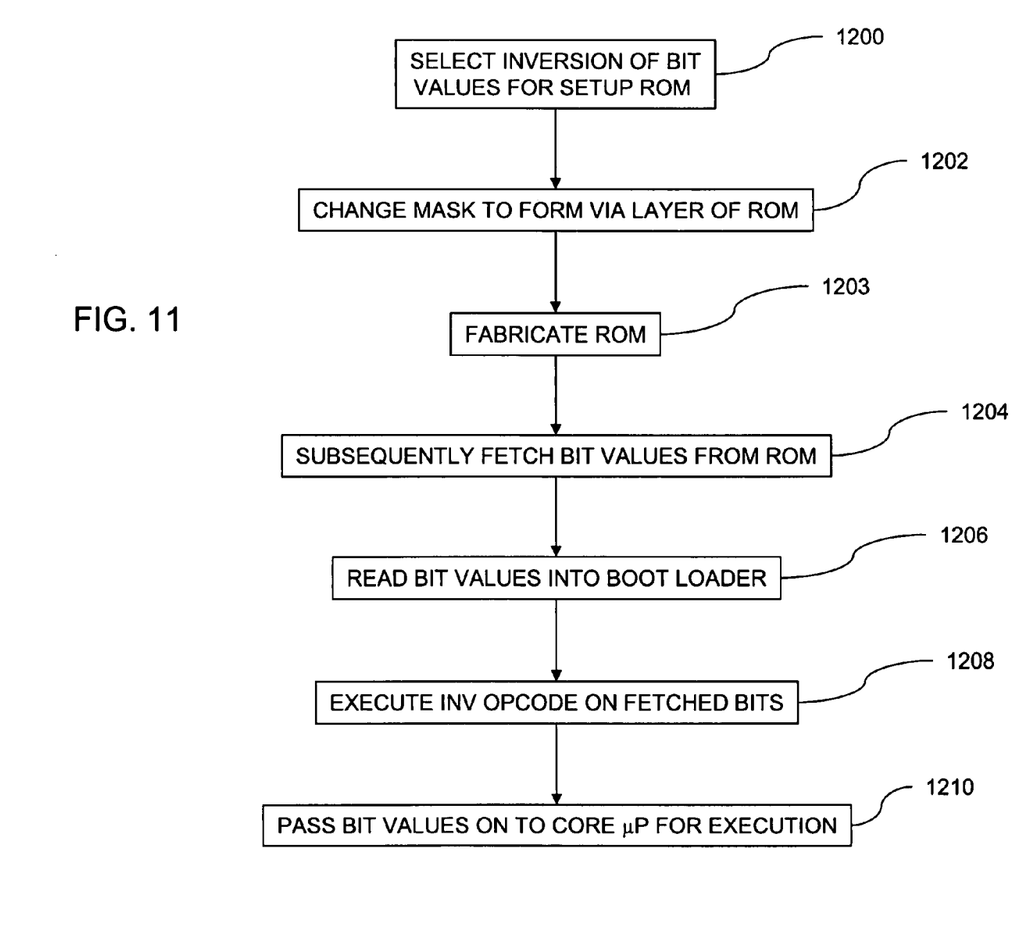
FIG. 11 is a more detailed example of a method for using a microprocessor to invert the bits in the ROM before programming the ROM, and upon retrieval.

FIG. 11 is a flow chart diagram of an exemplary implementation of one inversion method. At step 1200, a particular inversion method (referred to herein as "hot swapping") is selected from among the candidate modifications (as per step 1110, described above).

At step 1202, the necessary changes are made to one or more masks. Preferably, this method can be implemented by merely changing one mask (e.g., the mask for the programming layer). For example, writing the inverted data into the ROM can be accomplished by deleting any patterns for forming contacts in a ROM array area 202 of the ROM that are included in the first ROM design, and adding patterns for forming contacts to any bits which do not have contacts in the first ROM design. In addition, any patterns for forming vias in the ROM array that are included in the first ROM design are deleted, and patterns for forming vias to any bits which lack vias in the first ROM design are added.

At step 1203, the ROM containing design is fabricated. The fabrication process may include any conventional or future developed semiconductor fabrication steps, and may include but is not limited to: lithographic techniques, wafer dicing, testing and packaging.

At step 1204, after fabrication of the ROM containing design, the data are fetched from the ROM.

At step 1206, the bit values corresponding to a program executed by the embedded microprocessor are read into the embedded microprocessor.

At step 1208, the values are inverted by executing an inversion opcode. This adds an extra cycle when getting data from the ROM.

At step 1210, the data (code) is passed onto the microprocessor for execution.

Because the data are inverted by operation of a firmware inversion opcode, this method cannot be used to invert ROMs that are executed upon boot-up or are not under the control of the embedded micro-controller.

The method of FIG. 11 is just one example of a modification in which complementary bit values are programmed into the ROM, and are inverted in real-time upon access to restore the original bit values. Given the programming of complementary bit values into the ROM, a variety of techniques may be used to invert the data upon access.

Figure 3:
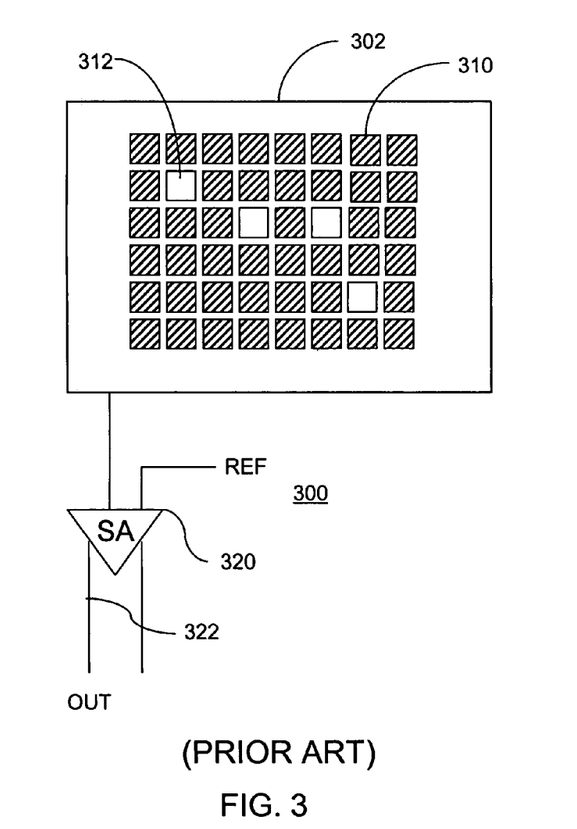
FIG. 3 is a diagram showing a conventional ROM having a sense amplifier for the output of data.

FIG. 3 shows another aspect of a conventional ROM array 300. The array includes a sense amplifier (SA) 320 at an output port thereof. Inversion of the bit values in the ROM 300 can be implemented via a mask change, in the manner described above with respect to the mask change for the embodiment of FIG. 2. For example, writing the inverted data into the ROM can be accomplished by deleting any patterns 310 for forming contacts in a ROM array area 302 of the ROM that are included in the first ROM design, and adding patterns 312 for forming contacts to any bits which do not have contacts in the first ROM design. This results in the ROM shown in FIG. 4.

Figure 4:
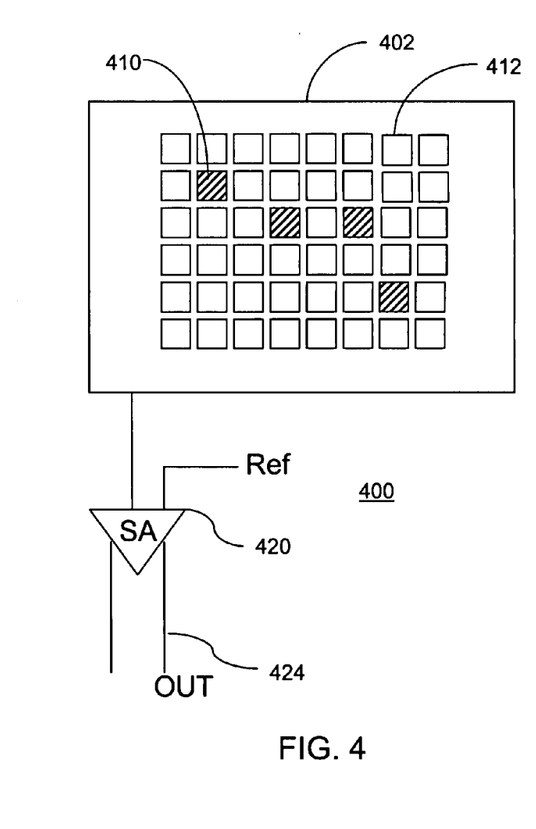
FIG. 4 is a diagram showing a ROM having inverted data stored therein, and a modification of the sense amplifier to invert data when accessed.

In FIG. 4, the ROM array 402 stores nearly all zeros 412 and very few ones 410. In this embodiment, hardware (SA 420) is used to invert the bits accessed from the ROM 402, instead of firmware. Comparing the examples of FIGS. 3 and 4, in FIG. 4, the output is taken from the opposite output rail 424 of the sense amplifier SA, whereas in FIG. 3, the output is taken from output rail 322. To implement the mask changes of FIG. 4, none of the logic after the output of the sense amplifier 420 is affected. Thus, any value stored in the ROM array 402 as a zero is passed on from the output of the sense amplifier 420 as a one, and any value stored as a one is passed on from the output of the sense amplifier as a zero.

The example of FIG. 4 is advantageous because it is has little impact on the mask designs outside of the one layer used to program the ROM. The only additional mask changes required are in the metal layer containing the connections between the sense amplifier output 424 and the data line that provides the output data to the core microprocessor. Further, because the inversion of the accessed data is performed by hardware, there is no limitation on which data can be inverted by this method. For example, the boot program can also be inverted before programming it into the ROM 402. During the boot sequence, the boot firmware is inverted in the same fashion as any other data in the ROM 402. Thus, the embodiment of FIG. 4 can potentially allow storage of more data in inverted form, to achieve a greater improvement in yield, relative to the firmware embodiment of FIG. 2. In addition, because the example of FIG. 4 merely takes an output from an existing sense amplifier, without inserting additional logic into the ROM system, a change from the conventional ROM of FIG. 3 to the embodiment of FIG. 4 does not change the timing of the system in any way.

Figures 5, 6:
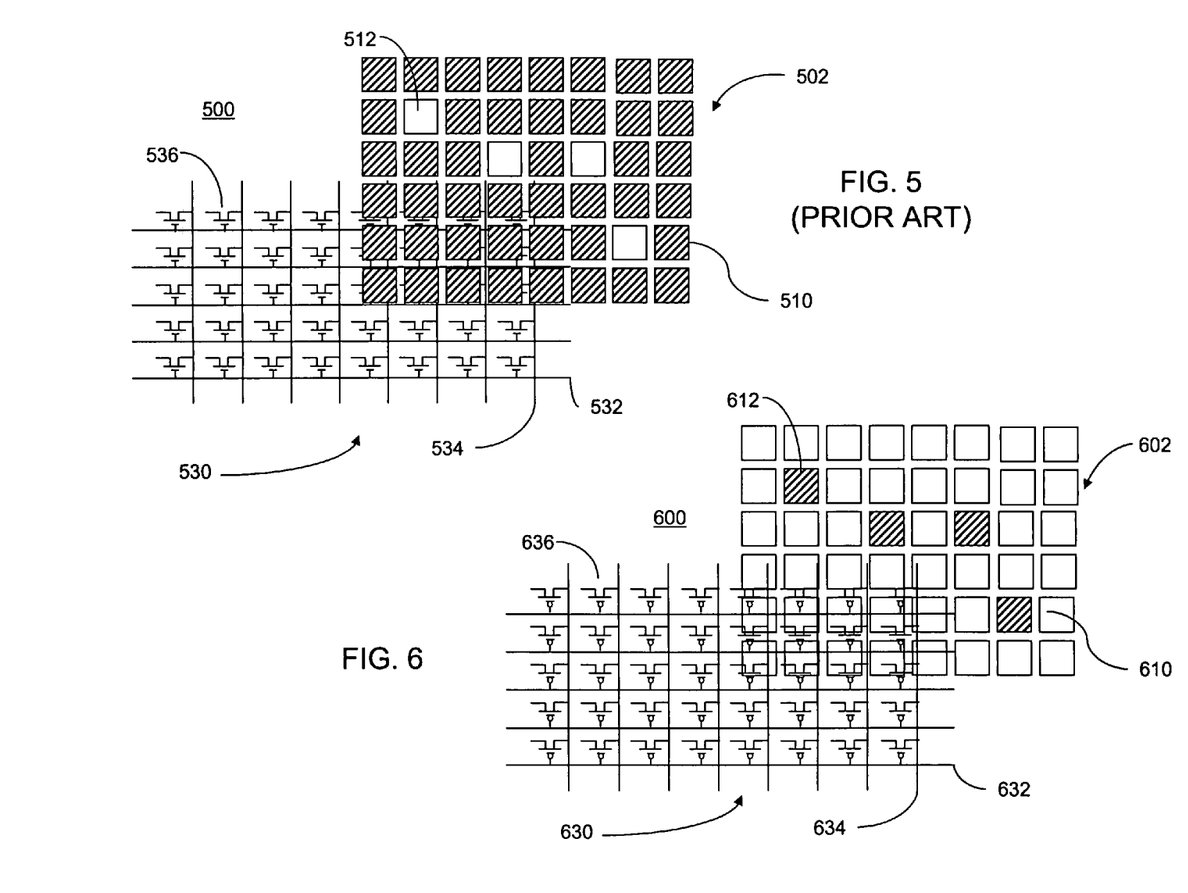
FIG. 5 is a diagram showing a conventional ROM having an array of NMOS transistors that define the ROM cells.
FIG. 6 is a diagram showing a ROM in which the bit values are inverted, and the transistors are changed to PMOS.

FIG. 5 shows another aspect of the conventional ROM array 500. In FIG. 5, the ROM array 500 has a rectangular array 530 of NMOS transistors 536 arranged in rows and columns, with a respective memory cell at the intersection of each row (gate) line 532 and column (data) line 534.

In the embodiment of FIG. 6, the inverted data are programmed into the ROM array 602 during programming, in the manner described above with reference to the programming of the arrays of FIGS. 2 and 4. In the example of FIG. 6, the data can be inverted when fetched from the ROM by substituting PMOS transistors 636 (FIG. 6) for the NMOS transistors 536 of FIG. 5. The mask used to fabricate the ROM array area 502 of the first ROM design is an N+ diffusion mask, and the change can be implemented by replacing the N+ diffusion mask with a P+ diffusion mask and converting power bus lines from VDD to GND via corresponding mask changes. By changing from NMOS transistors 536 to PMOS transistors 636, the effect of applying respective high and low voltages to the gate electrodes of the transistors are reversed, so that the bits programmed as ones are read as zeros, and the bits programmed as zeros are read as ones.

The example of FIG. 6 can be applied to any type of data stored in the ROM 602, including the codes for the boot sequence. In addition, the change from NMOS transistors 536 to PMOS transistors 636 may address other issues that may be present. For example, if there are N+ copper depletion problems (a failure mode present in some modern fabrication processes specific to stacked N+contacts and vias), then the switch from NMOS transistors 536 to PMOS transistors 636 will alleviate those problems. Thus, this method may potentially improve yield more than either the embodiments of FIGS. 2 and 4 in some configurations. However, the mask changes of the switch from NMOS transistors 536 to PMOS transistors 636 are greater than those for the embodiments of FIGS. 2 and 4. For example, the masks for the programming layer, ND, PD and some metal layers may be affected. Thus, if the fabrication process is already in production, this method would have greater impacts (more masks replaced) than the methods of FIGS. 2 and 4.

Although FIGS. 5 and 6 show an example where the first ROM array design includes an array of NMOS transistors 536, and the modification to improve yield comprises changing the NMOS transistors 536 to PMOS transistors 636, this is only an example. In another ROM, wherein PMOS transistors are provided at the intersections of the gate lines and drain lines (as shown in FIG. 6), inversion of the data may be accomplished by switching the PMOS transistors to NMOS transistors (as shown in FIG. 5). In this case, the original mask used to fabricate the ROM array area of the first ROM design is a P+ diffusion mask, and the modifications include replacing the P+ diffusion mask in the ROM array with an N+ diffusion mask and converting power bus lines from GND to VDD via corresponding mask changes. One skilled in the art will understand that in the case of changing PMOS transistors to NMOS transistors, the initial configuration does not have an N+ copper diffusion problem, so the yield improvement may not be as large when the modification comprises substituting NMOS transistors for PMOS transistors as when the modification comprises substituting PMOS transistors for NMOS.

Thus, FIGS. 2, 4 and 6 provide three different methods of inverting data when the data are accessed from the ROM 202, 402 or 602, respectively. These methods can be expected to provide respectively different improvements in yield, and the implementations of these methods involve respectively different degrees of difficulty or expense (as determined by the number of masks that are changed).

As noted above, another set of alternatives for improving the yield of the ROM includes compressing the data stored in the ROM. By reducing the number of bits stored, the number of ones stored is also reduced.

Figure 7:
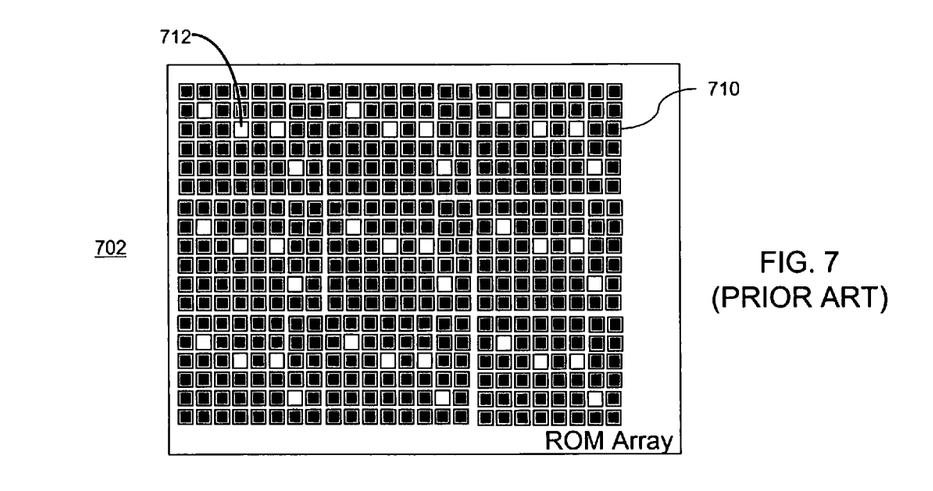
FIG. 7 is a diagram showing an amount of space occupied by data in a conventional ROM.
Figure 8:
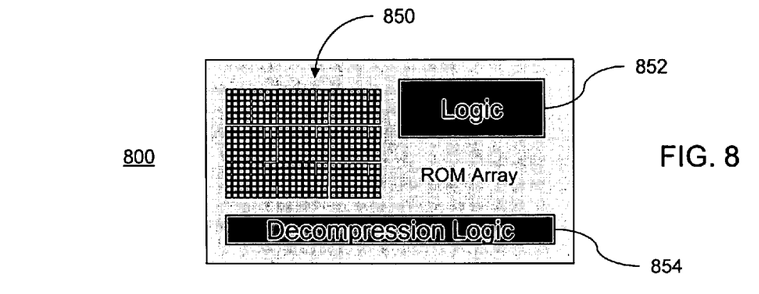
FIG. 8 is a block diagram of a ROM of reduced size, in which the data of FIG. 7 are compressed before being programmed into the ROM, and logic is added to invert the data when the data are accessed.

FIGS. 7 and 8 show one example of a method including compression. FIG. 7 shows the original ROM array 702 having a large number of ones 710 and a small number of zeros. FIG. 8 symbolically shows a ROM 802 programmed with compressed data, with a smaller number of bits in the ROM 802 than in the ROM 702. The data may be compressed using an algorithm such as run length encoding (RLE), or a variable length encoding algorithm, such as Lempel-Ziv coding (LZ) or Huffman coding. Thus, the use of compression reduces the chip size. Because the total number of bits stored in the ROM is reduced, the number of ones is also reduced.

Decompression may be possible using the embedded core microprocessor plus extra code or extra logic. The compression method may impact all of the interconnect layers (and therefore, all the associated masks), and may involve additional logic. Because the data must be decompressed when accessed, implementation of a compression method may involve timing issues. Also, any or all of the mask layers may be affected.

Figure 9:
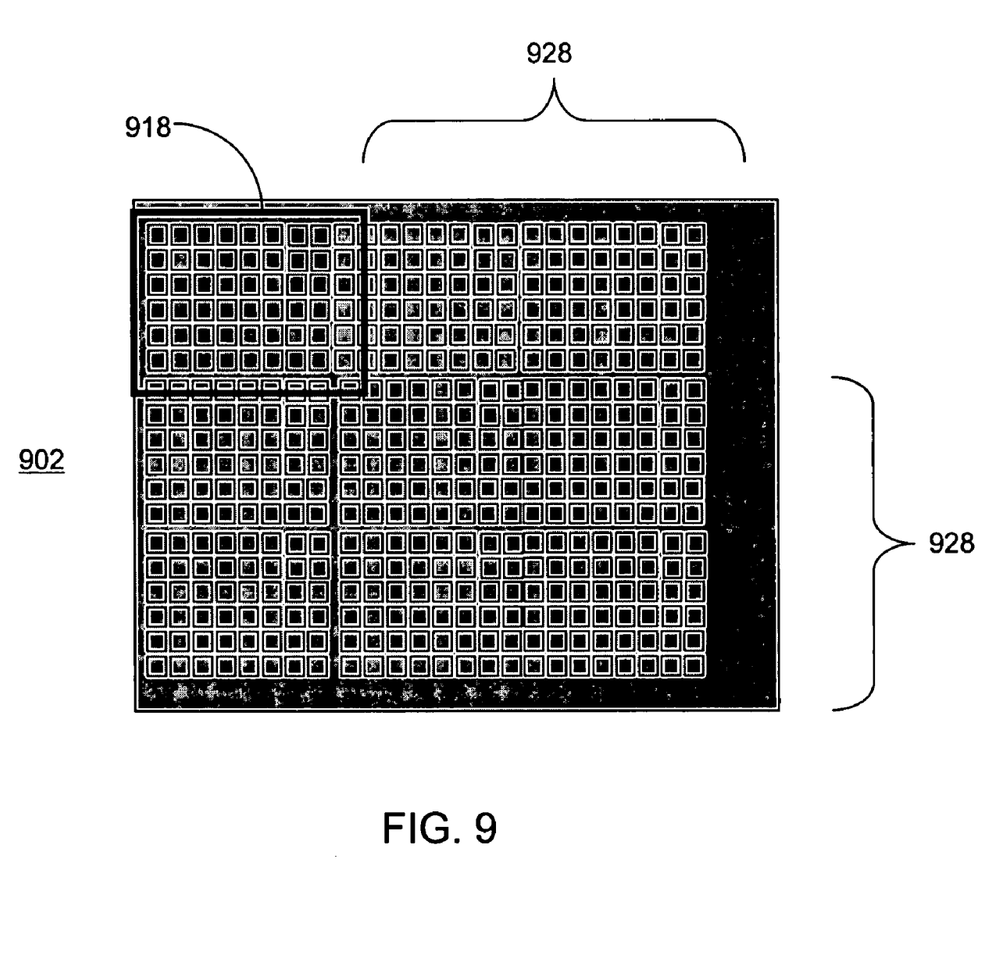
FIG. 9 is a block diagram showing a ROM of a size similar to that of FIG. 7, with the data compressed by an external microprocessor, and much of the space unprogrammed.

FIG. 9 shows another alternative compression method (referred to herein as "modified code compression"), in which changes to the masks are minimized. The programming layer mask is modified to program compressed data into the ROM 902, instead of the full uncompressed data. Thus, only a small portion 918 of the ROM 902 is programmed, and the remaining portion 928 is not programmed (i.e., contains all zeros). The coding method may be any of the algorithms described above (RLE, LZ, Huffman coding, or the like). The programmed portion 918 of the ROM 902 may contain the same data as the ROM 802 described above. Instead of reducing the ROM size (with corresponding impacts on maskworks), a substantial portion 928 of the ROM array 902 is simply not programmed (or accessed subsequently). Thus, there is no need to change the overall ROM hardware design from that shown in FIG. 7. To avoid any need for additional decompression logic, the decompression may be performed by the embedded microprocessor (so long as the microprocessor has sufficient bandwidth to perform the code decompression.

Five methods are described above with reference to FIGS. 2-9, for improving the yield through inversion or compression of the data programmed into the ROM, and inverting or decompressing the data when accessed, and other methods of inversion or compression may also be used. A method is further provided for selecting an appropriate one of these methods for a given ROM. Preferably, the selection method can be implemented in a computer program executed by a general purpose computer, and in a computer readable storage medium encoded with computer program code for performing the method.

Figure 12A:
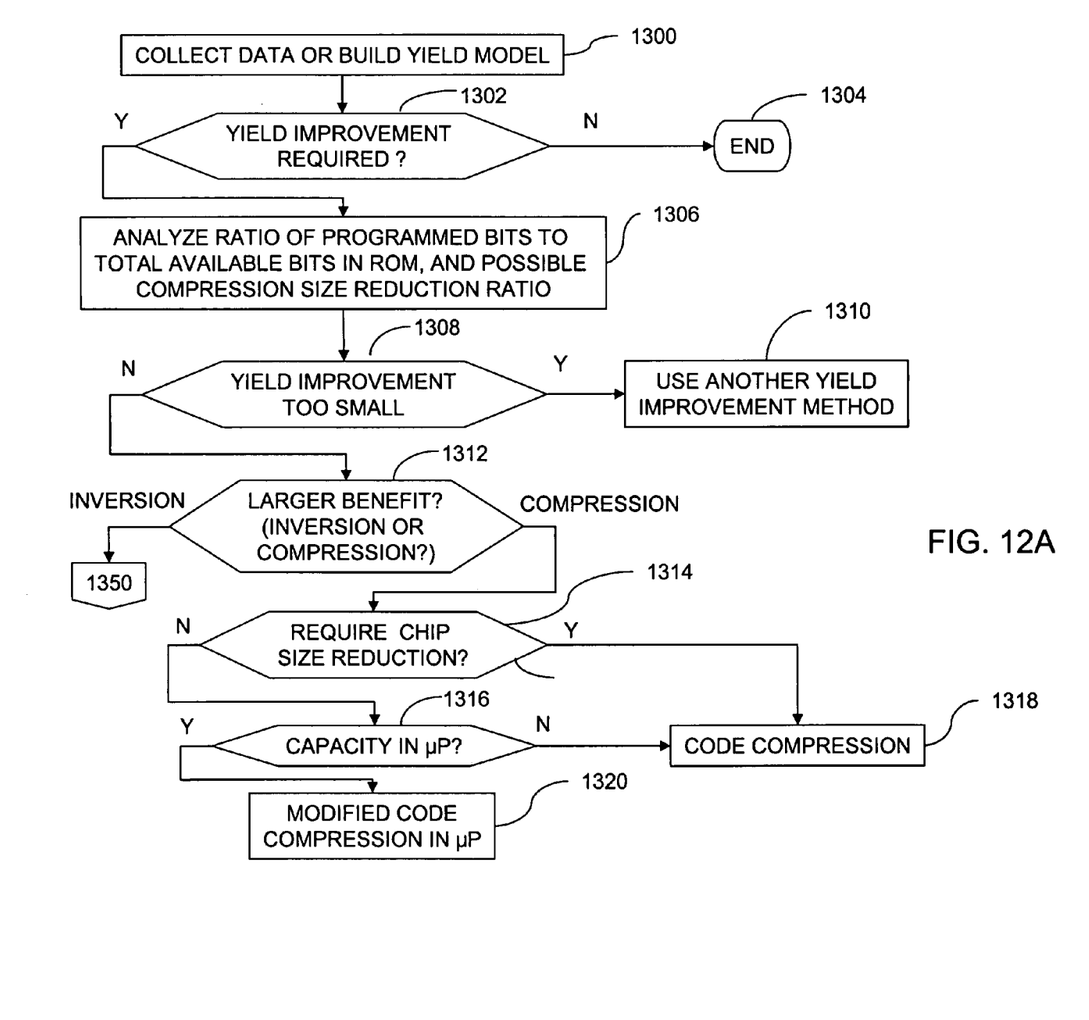
FIGS. 12A and 12B together form a flow chart diagram showing a method for analyzing whether to use inversion or compression to improve yield, and which of a plurality of available inversion and compression methods to use.
Figure 12B:
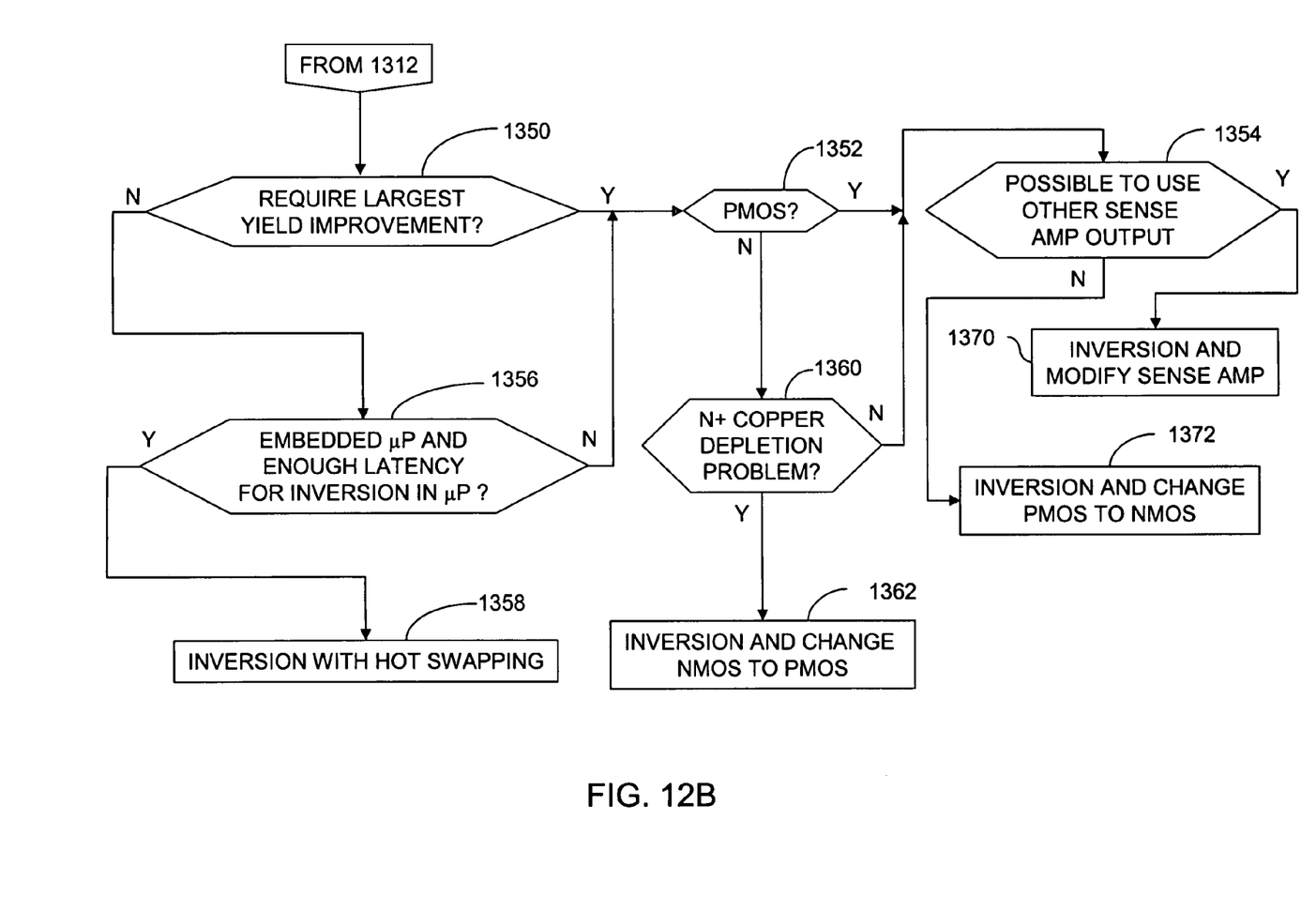

FIGS. 12A and 12B are flow chart diagrams of an exemplary selection method.

At step 1300, data characterizing the ROM fabrication process yield are collected (if the process is already on line), or a yield model is constructed, if the fabrication process has not yet been tested in silicon.

At step 1302, a determination is made whether the yield from the current process (or the expected yield from the current design) is acceptable. If no yield improvement is required, the inquiry ends at step 1304. If improvement is required, then step 1306 is performed.

At step 1306, an analysis is performed, which evaluates possible improvement from inversion and possible improvement from compression. Preferably, a normalized measure is adopted to allow this comparison.

In one example, a first ratio $q_i$ is computed to characterize the potential yield improvement from inversion, and a second ratio $q_c$ is computed to characterize the potential improvement from compression.

In some embodiments, $q_i$ is given by: the ratio $$q_i = \frac{e^{-\lambda_1 N(1-r)} e^{-\lambda_0 Nr}}{e^{-\lambda_1 Nr} e^{-\lambda_0 N(1-r)}},$$

where r is the ratio of the number of "1" bits stored in a ROM to the number of "0" bits stored in the ROM, N is a total number of bits of the ROM array, $\lambda_1$ is the failure rate of a ROM bit programmed with a "1", and $\lambda_0$ is the failure rate of a ROM bit programmed with a "0". The failure rates are usually expressed as parts-per-billion or parts-per-million. Essentially, $q_i$ is the ratio of the expected yield of the ROM array fabrication process if the data are inverted, divided by the expected yield of the ROM array fabrication process if the data are not inverted.

In some embodiments, a different metric may be computed for compression. A ratio $q_c$ can be used to determine whether to store the data in compressed form. The value of the ratio $q_c$ may be defined as A/A' where A' is the sum of an area of the ROM required to store the compressed data plus an area of a decompression logic block used to decompress the data upon subsequent access, and A is the area of the ROM required to store uncompressed data according to the first ROM design. The ratio of A/A' approximates the ratio of the number of bits of uncompressed code and/or data to the number of bits of compressed code and/or data. This ratio, in turn, approximates the ratio of the number of ones in the compressed code and/or data to the number of ones in the compressed code and/or data.

At step 1308, a determination is made whether the possible improvement from both of the methods is too small to justify inversion or compression. For example, the values of $q_i$ and $q_c$ may be compared to a threshold value (e.g., 1.005). If both the values $q_i$ and $q_c$ are less than the threshold value, then neither of the two changes is cost effective for improving the yield of the process (expected improvement<0.5%), and step 1310 is executed. If either or both of the values $q_i$ and $q_c$ is (are) greater than or equal to the threshold, then one or both of the methods (inversion and/or compression) may be cost effective, and step 1312 is executed.

At step 1310, if neither inversion nor compression is effective to provide adequate improvement in yield, then another method should be evaluated.

At step 1312, a determination is made which method (inversion or compression) is expected to provide greater yield improvement, based on which ratio, $q_i$ or $q_c$ is greater. If $q_i$ is greater then step 1350 (selection of an inversion technique) is executed. If $q_c$ is greater, then step 1314 (selection of a compression technique) is executed.

Steps 1314 to 1320 provide a method for selecting from among a plurality of compression methods.

At step 1314, a determination is made whether a smaller chip size can be tolerated. If an all-layer mask change is required for some other reason besides yield improvement or the cost is offset by gains in yield, the choice of a yield improvement method by full code inversion may be considered. If so, step 1318 is executed. If not, step 1316 is executed.

At step 1316, a determination is made whether there is sufficient capacity in the embedded microprocessor to perform decompression. If there is sufficient capacity, step 1320 is executed. If not, then step 1318 is executed.

At step 1318, if size reduction is required or there is insufficient capacity in the microprocessor to decompress the data, then the ROM array size can be reduced to accommodate the size of the compressed data, and code compression can be performed by additional logic.

At step 1320, if size reduction is not required and there is sufficient capacity in the microprocessor to decompress the data, then the ROM array size is not changed, and "modified code compression" can be performed by storing compressed data in the same manner as described above, and decompressing the data in the embedded microprocessor upon access, using firmware.

Steps 1350 to 1362 provide a method for selecting from among a plurality of inversion algorithms.

At step 1350, a determination is made whether the largest possible yield improvement is needed. If the maximum yield improvement is required, then step 1352 is executed. If the yield improvement can be less than the maximum possible, then step 1356 is executed.

At step 1356, a determination is made whether there is an embedded microprocessor that has enough latency for inversion of the accessed bits in the microprocessor. If there is enough latency, then step 1358 is executed. If not, then step 1352 is executed.

At step 1358, the method of inversion with hot swapping (FIG. 2) is selected.

At step 1352, if the ROM array comprises PMOS transistors, then step 1354 is executed. If the ROM array comprises NMOS transistors, then step 1360 is executed.

At step 1354, a determination is made whether it is practical to modify the design to take an output signal from another terminal of the sense amplifier. In some circumstances (e.g., where insufficient information is available about the sense amplifier), it may not be practical to do so. If the modification is possible, step 1370 is executed. If the modification is not practical, step 1372 is executed.

At step 1360, a determination is made whether there is an N+ copper depletion problem. If there is an N+ copper depletion problem, then step 1362 is executed. If not, then step 1354 is executed.

At step 1362, inverted data are programmed into the ROM, and the NMOS transistors are replaced by PMOS transistors.

At step 1370, inverted data are programmed into the ROM, and upon access, the data are again inverted in real-time by taking the output from the opposite side of the sense amplifier 420.

At step 1372, inverted data are programmed into the ROM, and the original data are obtained by modifying the sense amplifier to take the data values from the opposite side of the sense amplifier, as shown in FIG. 4.

The decision tree of FIGS. 12A and 12B represents one exemplary resolution of the problem of balancing the desire for large yield improvement against the desire to minimize impacts to the design (particularly if expensive masks have already been provided). In this decision tree, a candidate modification is selected to provide a minimum cost modification within the class (inversion or compression) having the solution that provides the greatest yield improvement. The solution chosed by FIGS. 12A and 12B may not be the global minimum cost solution or the global maximum yield improvement solution. Other algorithms may be used to provide viable solutions. For example, other strategies may include selecting the global minimum cost solution (measured by the number of mask modifications), the global maximum yield improvement solution (measured by the greates value of $q_c$ or $q_i$), or the solution providing the best yield improvement within the class (inversion or compression) that provides the minimum cost solution.

In addition, although the examples described above involved yield improvement and minimizing the number of masks impacted, additional criteria may be based on any other design constraints imposed by the specifications of the product under optimization.

Although an example is described in FIG. 12 where a single modification is selected for the ROM, other embodiments are contemplated, in which a single system has a plurality of ROMs, and two or more of the candidate inversion/compression methods are used. A different criterion be used for each block or ROM.

The present invention may be embodied in the form of computer-implemented processes and apparatus for practicing those processes. The present invention may also be embodied in the form of computer program code embodied in tangible media, such as floppy diskettes, read only memories (ROMs), CD-ROMs, hard drives, "ZIP™" high density disk drives, flash memory drives, or any other computer-readable storage medium, wherein, when the computer program code is loaded into and executed by a computer, the computer becomes an apparatus for practicing the invention. The present invention may also be embodied in the form of computer program code, for example, whether stored in a storage medium, loaded into and/or executed by a computer, or transmitted over some transmission medium, such as over the electrical wiring or cabling, through fiber optics, or via electromagnetic radiation, wherein, when the computer program code is loaded into and executed by a computer, the computer becomes an apparatus for practicing the invention. When implemented on a general-purpose processor, the computer program code segments configure the processor to create specific logic circuits.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method of improving yield of a process for fabricating a read-only memory (ROM), comprising the steps of:
   evaluating a yield of a ROM fabrication process associated with a first ROM design;
   identifying at least two candidate ROM design modifications, at least one of the candidate ROM design modifications comprising inversion of bit values of data to be stored in the ROM;
   applying a plurality of criteria including at least an amount of fabrication process yield improvement and a difficulty of implementation associated with each candidate ROM design modification;
   selecting one of the candidate ROM design modifications based on the application of the criteria; and
   performing a modified ROM fabrication process to fabricate a ROM according to the selected ROM design modification.

2. The method of claim 1, further comprising:
   using a modified version of at least one mask used in the first ROM design to make the ROM, so that the ROM stores bit values that are inverted relative to the bit values of the first ROM design;
   reading the bit values from the ROM;
   inverting the bit values using an embedded microprocessor before utilizing the data represented by the inverted bit values.

3. The method of claim 2, wherein a design of the mask is modified by at least one of the group consisting of:

(3A) deleting any patterns for forming contacts in a ROM array area of the ROM that are included in the first ROM design, and adding patterns for forming contacts to any bits which do not have contacts in the first ROM design;

(3B) deleting any patterns for forming vias in the ROM array that are included in the first ROM design, and adding patterns for forming vias to any bits which lack vias in the first ROM design (3C) if the mask used to fabricate the ROM array area of the first ROM design is an N+ diffusion mask, replacing the N+ diffusion mask with a P+ diffusion mask and converting power bus lines from VDD to GND via corresponding mask changes; or (3D) if the mask used to fabricate the ROM array area of the first ROM design is an P+ diffusion mask, replacing the P+ diffusion mask in the ROM array with an N+ diffusion mask and converting power bus lines from VDD to GND via corresponding mask changes.

4. The method of claim 3, wherein the candidate ROM design modifications include design modifications to which two or more of the steps 3A, 3B, 3C, and 3D correspond.

5. The method of claim 1, wherein one of the criteria is a number of masks changed to implement each of the candidate ROM design modifications.

6. The method of claim 1 wherein one of the criteria is based on the ratio $q_i$ given by:

$$q_i = \frac{e^{-\lambda_1 N(1-r)} e^{-\lambda_0 Nr}}{e^{-\lambda_1 Nr} e^{-\lambda_0 N(1-r)}},$$

where r is the ratio of the number of "1" bits stored in a ROM to the number of "0" bits stored in the ROM, N is a total number of bits of the ROM array, $\lambda_1$ is the failure rate of a ROM bit programmed with a "1", and $\lambda_0$ is the failure rate of a ROM bit programmed with a "0".

7. The method of claim 1, wherein:
inversion of the bit values in the ROM is implemented via a mask change;
a sense amplifier senses the bit values in the ROM;
in the first ROM design, a first output on a first side of the sense amplifier is used; and
in the selected ROM design modification, a second output on a second side of the sense amplifier is used, wherein the change from the first side to the second side is implemented via a mask change.

8. The method of claim 7, wherein a design of the mask is modified by at least one of the group consisting of:

(8A) deleting any patterns for forming contacts in a ROM array area of the ROM that are included in the first ROM design, and adding patterns for forming contacts to any bits which do not have contacts in the first ROM design;

(8B) deleting any patterns for forming vias in the ROM array that are included in the first ROM design, and adding patterns for forming vias to any bits which lack vias in the first ROM design (8C) if the mask used to fabricate the ROM array area of the first ROM design is an N+ diffusion mask, replacing the N+ diffusion mask with a P+ diffusion mask and converting power bus lines from VDD to GND via corresponding mask changes; or (8D) if the mask used to fabricate the ROM array area of the first ROM design is an P+ diffusion mask, replacing the P+ diffusion mask in the ROM array with an N+ diffusion mask and converting power bus lines from GND to VDD via corresponding mask changes.

9. The method of claim 7 wherein the candidate ROM design modifications include design modifications to which two or more of the steps 8A, 8B, 8C, and 8D correspond.

10. The method of claim 7, wherein one of the criteria is a number of masks changed to implement each of the candidate ROM design modifications.

11. The method of claim 7 wherein one of the criteria is based on the ratio $q_i$ given by:

$$q_i = \frac{e^{-\lambda_1 N(1-r)} e^{-\lambda_0 Nr}}{e^{-\lambda_1 Nr} e^{-\lambda_0 N(1-r)}}$$

where r is the ratio of the number of "1" bits stored in a ROM to the number of "0" bits stored in the ROM, N is a total number of bits of the ROM array, $\lambda_1$ is the failure rate of a ROM bit programmed with a "1", and $\lambda_0$ is the failure rate of a ROM bit programmed with a "0".

12. The method of claim 1, wherein the first ROM design includes storing the data in an uncompressed state, and at least one candidate ROM design modification comprises compression of the data to be stored in the ROM.

13. The method of claim 12, wherein the compression comprises variable length encoding and decompression is done in real-time by an embedded microprocessor when the data are accessed.

14. The method of claim 12, wherein the compression comprises run length encoding and decompression is done in real-time by an embedded microprocessor when the data are accessed.

15. The method of claim 12, wherein the compression comprises variable length encoding and decompression is done by a decompression logic block.

16. The method of claim 12, wherein the compression comprises run length encoding and decompression is done by a decompression logic block.

17. The method of claim 12 wherein a ratio $q_c$ is used to determine whether to store the data in compressed form, and the value of the ratio $q_c$ is defined as A/A' where A' is the sum of an area of the ROM required to store the compressed data plus an area of a decompression logic block used to decompress the data upon subsequent access, and A is the area of the ROM required to store uncompressed data according to the first ROM design.

18. A ROM fabricated by the method of claim 1.

19. A method of improving yield of a process for fabricating a read-only memory (ROM), comprising the steps of:
evaluating a ROM fabrication process associated with a first ROM design;
identifying at least two candidate ROM design modifications, at least one of the candidate ROM design modifications comprising inversion of bit values of data to be stored in the ROM, at least one of the candidate ROM design modifications comprising storing the data in a compressed form;
applying a plurality of criteria including at least an amount of fabrication process yield improvement and a difficulty of implementation associated with each candidate ROM design modification; and
selecting one of the candidate ROM design modifications based on the application of the criteria,
performing a modified ROM fabrication process to fabricate a ROM according to the selected ROM design modification.

20. The method of claim 19 wherein the plurality of criteria include at least one of the group consisting of:
  (A) selecting either inversion or compression of the data to be stored in the ROM depending on which of a first value and a second value is larger, where the first value characterizes an expected yield improvement if bits in the ROM are inverted and the second value characterizes an expected yield improvement if data to be stored in the ROM are compressed before storage in the ROM;
  (B) rejecting any design modification for which the corresponding first or second value is less than a threshold value;
  (C) minimizing the number of mask changes associated with implementation of the candidate ROM design modifications; or
  (D) satisfying a design constraint imposed by a specification of the ROM.

21. A ROM fabricated by the method of claim 19.

22. A computer readable medium encoded with computer program code, wherein, when the computer program code is executed by a processor, the processor performs a method of improving yield of a process for fabricating a design containing read-only memory (ROM), comprising the steps of:
  evaluating a yield of a fabrication process associated with a first ROM-containing design;
  identifying at least two candidate ROM design modifications, at least one of the candidate ROM design modifications comprising inversion of bit values of data to be stored in the ROM;
  applying a plurality of criteria including at least an amount of fabrication process yield improvement and a difficulty of implementation associated with each candidate ROM design modification; and
  selecting one of the candidate ROM design modifications based on the application of the criteria, wherein a modified fabrication process is performed to fabricate a ROM according to the selected ROM design modification.

23. The computer readable medium of claim 22 wherein one of the criteria is based on the ratio $q_i$ given by:

$$q_i = \frac{e^{-\lambda_1 N(1-r)} e^{-\lambda_0 Nr}}{e^{-\lambda_1 Nr} e^{-\lambda_0 N(1-r)}},$$

where r is the ratio of the number of "1" bits stored in a ROM to the number of "0" bits stored in the ROM, N is a total number of bits of the ROM array, $\lambda_1$ is the failure rate of a ROM bit programmed with a "1", and $\lambda_0$ is the failure rate of a ROM bit programmed with a "0".

24. The computer readable medium of claim 22 wherein the plurality of criteria include at least one of the group consisting of:
  (A) selecting either inversion or compression of the data to be stored in the ROM depending on which of a first value and a second value is larger, where the first value characterizes an expected yield improvement if bits in the ROM are inverted and the second value characterizes a reduction in ROM size if data to be stored in the ROM are compressed before storage in the ROM;
  (B) rejecting any design modification for which the corresponding first or second value is less than a threshold value;
  (C) minimizing the number of mask changes associated with implementation of the candidate ROM design modifications; or
  (D) satisfying a design constraint imposed by a specification of the ROM.

* * * * *